(12) United States Patent
Endoh et al.

(10) Patent No.: US 10,821,558 B2
(45) Date of Patent: Nov. 3, 2020

(54) BONDING MATERIAL AND BONDING METHOD USING SAME

(71) Applicant: Dowa Electronics Materials Co., Ltd., Tokyo (JP)

(72) Inventors: Keiichi Endoh, Okayama (JP); Hiromasa Miyoshi, Okayama (JP); Kimikazu Motomura, Okayama (JP); Satoru Kurita, Okayama (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 28 days.

(21) Appl. No.: 15/506,823

(22) PCT Filed: Aug. 31, 2015

(86) PCT No.: PCT/JP2015/004401
§ 371 (c)(1),
(2) Date: Feb. 27, 2017

(87) PCT Pub. No.: WO2016/035314
PCT Pub. Date: Mar. 10, 2016

(65) Prior Publication Data
US 2017/0252874 A1 Sep. 7, 2017

(30) Foreign Application Priority Data

Sep. 1, 2014 (JP) .................................. 2014-176724
Aug. 28, 2015 (JP) .................................. 2015-168573

(51) Int. Cl.
*B23K 35/00* (2006.01)
*B23K 35/30* (2006.01)
*B23K 1/19* (2006.01)
*B23K 1/008* (2006.01)
*B23K 5/00* (2006.01)
(Continued)

(52) U.S. Cl.
CPC .......... *B23K 35/302* (2013.01); *B22F 1/0011* (2013.01); *B22F 1/0059* (2013.01); *B22F 7/008* (2013.01); *B22F 9/02* (2013.01); *B22F 9/24* (2013.01); *B23K 1/008* (2013.01); *B23K 1/0016* (2013.01); *B23K 1/19* (2013.01); *B23K 5/00* (2013.01); *B23K 20/026* (2013.01); *B23K 20/16* (2013.01); *B23K 20/233* (2013.01); *B23K 35/025* (2013.01); *B23K 35/36* (2013.01); *C22C 9/00* (2013.01); *H01B 1/22* (2013.01); *H01L 24/27* (2013.01); *H01L 24/29* (2013.01); *H01L 24/83* (2013.01); *B22F 7/062* (2013.01); *B23K 2101/42* (2018.08); *B23K 2103/12* (2018.08); *H01L 2224/27848* (2013.01); *H01L 2224/29294* (2013.01); *H01L 2224/29347* (2013.01); *H01L 2224/32245* (2013.01); *H01L 2224/83075* (2013.01); *H01L 2224/8384* (2013.01); *H01L 2224/83192* (2013.01); *H01L 2224/83204* (2013.01)

(58) Field of Classification Search
CPC .... B23K 35/302; B23K 1/008; B23K 20/233; B23K 20/16; B23K 20/026; B23K 5/00; B23K 1/19; B23K 35/36; B23K 1/0016; B23K 35/025; B23K 2103/12; B23K 2101/42; B23K 35/0244–025; B23K 3/0638; B23K 3/0623; B23K 35/00; B23K 35/22; B23K 35/34; B22F 9/24; B22F 7/008; B22F 1/0059; B22F 1/0011; B22F 9/02; B22F 7/062; H01L 24/83; H01L 24/29; H01L 24/27; H01L 2224/29347; H01L 2224/29294; H01L 2224/27848; H01L 2224/8384; H01L 2224/32245; H01L 2224/83192; H01L 2224/83075; H01L 2224/83204; C22C 9/00; H01B 1/22
USPC ......... 228/248.1–248.5, 56.3, 262.6–262.61; 148/23–24
See application file for complete search history.

(56) References Cited

U.S. PATENT DOCUMENTS 2,606,132 A * 8/1952 Klinker .............. B23K 35/3601
148/24
5,035,837 A * 7/1991 Saeki ..................... B22F 1/0059
106/1.13
(Continued)

FOREIGN PATENT DOCUMENTS

EP     2587899 A1     5/2013
JP     53147669 A  *  12/1978
(Continued)

OTHER PUBLICATIONS

Machine translation of JP 53-147669 (no date available).*
(Continued)

*Primary Examiner* — Kiley S Stoner
(74) *Attorney, Agent, or Firm* — Bachman and LaPointe PC; George Coury

(57) ABSTRACT

There is provided an inexpensive bonding material, which can be easily printed on articles to be bonded to each other and which can suppress the generation of voids in the bonded portions of the articles to be bonded to each other, and a bonding method using the same. In a bonding material of a copper paste which contains a copper powder containing 0.3% by weight or less of carbon and having an average particle diameter of 0.1 to 1 µm, and an alcohol solvent, such as a monoalcohol, a diol, a triol or a terpene alcohol, the content of the copper powder is in the range of from 80% by weight to 95% by weight, and the content of the alcohol solvent is in the range of from 5% by weight to 20% by weight.

7 Claims, No Drawings

(51) Int. Cl.
*C22C 9/00* (2006.01)
*B23K 20/02* (2006.01)
*B23K 20/16* (2006.01)
*B22F 1/00* (2006.01)
*H01L 23/00* (2006.01)
*B22F 9/24* (2006.01)
*B23K 20/233* (2006.01)
*B22F 7/00* (2006.01)
*B22F 9/02* (2006.01)
*B23K 1/00* (2006.01)
*B23K 35/02* (2006.01)
*B23K 35/36* (2006.01)
*H01B 1/22* (2006.01)
*B22F 7/06* (2006.01)
*B23K 103/12* (2006.01)
*B23K 101/42* (2006.01)

(56) References Cited

U.S. PATENT DOCUMENTS

| | | | | |
|---|---|---|---|---|
| 5,514,326 | A * | 5/1996 | Tani | B22F 1/0003 419/10 |
| 2005/0142027 | A1 | 6/2005 | Matsuki | C22C 1/0425 420/495 |
| 2006/0021465 | A1* | 2/2006 | Uchida | B22F 1/0059 75/252 |
| 2006/0137488 | A1* | 6/2006 | Sakaue | B22F 1/0007 75/255 |
| 2007/0248801 | A1* | 10/2007 | Nakao | H01L 21/4807 428/210 |
| 2008/0156413 | A1* | 7/2008 | Nomiya | H05K 1/092 156/89.12 |
| 2009/0039507 | A1* | 2/2009 | Funaki | H01L 24/03 257/737 |
| 2011/0101283 | A1* | 5/2011 | Lu | C09D 5/24 252/507 |
| 2012/0219787 | A1* | 8/2012 | Jun | H01B 1/22 428/328 |
| 2013/0058824 | A1* | 3/2013 | Hirama | B44F 5/00 419/7 |
| 2013/0069014 | A1* | 3/2013 | Lee | H01B 1/22 252/512 |
| 2013/0105980 | A1* | 5/2013 | Yasuda | H01B 1/22 257/772 |
| 2014/0216798 | A1* | 8/2014 | Kawato | H01B 1/026 174/257 |
| 2014/0287158 | A1* | 9/2014 | Heyen | H05K 1/095 427/555 |
| 2014/0367619 | A1* | 12/2014 | Summers | H01B 1/22 252/512 |
| 2015/0014399 | A1* | 1/2015 | Ogashiwa | H01L 24/83 228/248.1 |
| 2015/0266090 | A1* | 9/2015 | Kamikoriyama | B22F 9/24 252/512 |
| 2016/0086688 | A1* | 3/2016 | Hongo | H01B 1/22 428/457 |
| 2017/0044383 | A1* | 2/2017 | Suh | H05K 3/102 |
| 2017/0190930 | A1* | 7/2017 | Lee | H01B 1/22 |
| 2017/0252801 | A1* | 9/2017 | Ida | H01B 5/00 |
| 2017/0252869 | A1* | 9/2017 | Fritzsche | B23K 35/262 |
| 2017/0278589 | A1* | 9/2017 | Yasuda | C01G 3/02 |
| 2018/0104747 | A1* | 4/2018 | Suganuma | B23K 35/025 |

FOREIGN PATENT DOCUMENTS

| | | | | |
|---|---|---|---|---|
| JP | 4362742 B2 | 11/2009 | | |
| JP | 2011080147 A | 4/2011 | | |
| JP | 2016053216 A | * 4/2016 | | B22F 9/24 |
| JP | 2016153530 A | * 8/2016 | | B22F 9/24 |
| WO | 2007034893 A1 | 3/2007 | | |
| WO | 2013146504 A1 | 10/2013 | | |
| WO | WO-2013146504 A1 | * 10/2013 | | H01L 24/83 |
| WO | 2014080662 A1 | 5/2014 | | |

OTHER PUBLICATIONS

International search report for Application No. PCT/JP2015/004401 dated Aug. 31, 2015.

European search report for patent application No. 15838051.9-1103 dated May 8, 2018.

* cited by examiner

BONDING MATERIAL AND BONDING METHOD USING SAME

TECHNICAL FIELD

The present invention relates generally to a bonding material and a bonding method using the same. More specifically, the invention relates to a bonding material of a copper paste containing a copper powder, and a method for bonding articles to each other using the same.

BACKGROUND ART

In recent years, it is proposed that a bonding material of a silver paste containing fine silver particles as metal particles is used to be arranged between articles to be heated for a predetermined period of time while applying pressure between the articles, to sinter silver in the bonding material to bond the articles to each other (see, e.g., Patent Document 1).

When such a bonding material is used for fixing an electronic part, such as an Si chip, on a metal substrate, after a silver paste containing fine silver particles dispersed in a solvent is applied on the substrate, the silver paste is heated to remove the solvent to form a pre-dried film on the substrate to arrange the electronic part thereon, and then, the pre-dried film is heated while applying pressure on the electronic part, so that it is possible to bond the electronic part to the substrate via a silver bonding layer.

PRIOR ART DOCUMENT(S)

Patent Document(s)

Patent Document 1: Japanese Patent Laid-Open No. 2011-80147 (Paragraph Numbers 0014-0020)

SUMMARY OF THE INVENTION

Problem to be Solved by the Invention

However, in the bonding material of Patent Document 1, the fine silver particles are used as metal particles, so that the bonding material is expensive. For that reason, it is desired to provide a bonding material using inexpensive metal particles in comparison with the fine silver particles.

Moreover, when articles are bonded to each other by means of the bonding material, if voids exist on the bonded surfaces thereof, even if the articles are bonded to each other at a desired bonding strength, stress is applied to the portions of the voids when cooling/heating cycles are repeatedly applied thereto. As a result, cracks are formed in the bonding layer from the voids, so that the reliability of bonding is deteriorated. For that reason, in order to satisfactorily bond articles to each other by means of the bonding material, it is required to suppress the generation of voids in the bonded portions, and it is required to suppress the amount of a solvent (dispersing medium) to be added (i.e., to increase the content of metal particles), the solvent causing voids. On the other hand, in order to satisfactorily apply a bonding material by screen printing using a metal mask, it is required to decrease the viscosity of the bonding material. However, if the viscosity of the bonding material is decreased, the content of metal in the bonding material is decreased. On the other hand, if the content of metal in the bonding material is increased, the viscosity of the bonding material is increased. Thus, the relationship between the viscosity of the bonding material and the content of metal in the bonding material is the trade-off relationship.

It is therefore an object of the present invention to eliminate the aforementioned problems and to provide an inexpensive bonding material, which can be easily printed on articles to be bonded to each other and which can suppress the generation of voids in the bonded portions of the articles to be bonded to each other, and a bonding method using the same. Thus, the inventors have made the present invention.

Means for Solving the Problem

In order to accomplish the aforementioned and other objects, the inventors have diligently studied and found that it is possible to provide an inexpensive bonding material, which can be easily printed on articles to be bonded to each other and which can suppress the generation of voids in the bonded portions of the articles to be bonded to each other, and a bonding method using the same, if there is provided a bonding material of a copper paste comprising a copper powder having an average particle diameter of 0.1 to 1 μm and an alcohol solvent, wherein the content of the copper powder is in the range of from 80% by weight to 95% by weight, and the content of the alcohol solvent is in the range of from 5% by weight to 20% by weight. Thus, the inventors have made the present invention.

According to the present invention, there is provided a bonding material of a copper paste comprising: a copper powder having an average particle diameter of 0.1 to 1 μm; and an alcohol solvent, wherein the content of the copper powder is in the range of from 80% by weight to 95% by weight, and the content of the alcohol solvent is in the range of from 5% by weight to 20% by weight.

In this bonding material, the content of carbon in the copper powder is preferably 0.3% by weight or less. The alcohol solvent is preferably a monoalcohol, a diol or a terpene alcohol, and may contain a triol. The bonding material preferably has a viscosity of not greater than 150 Pa·s when the viscosity of the bonding material is measured at 25° C. and 5 rpm by means of a rheometer. When the bonding material arranged between articles is heated to sinter copper therein to bond the articles to each other via a copper bonding layer, the percentage of an area occupied by voids with respect to the area of a bonded surface of the copper bonding layer is preferably 10% or less, and the shear strength is preferably 6 MPa or more.

According to the present invention, there is provided a bonding method comprising the steps of: arranging the above-described bonding material between articles; and heating the bonding material to sinter copper therein to form a copper bonding layer to bond the articles to each other with the copper bonding layer. In this bonding method, the heating of the bonding material is preferably carried out while pressure is applied between the articles.

Effects of the Invention

According to the present invention, it is possible to provide an inexpensive bonding material, which can be easily printed on articles to be bonded to each other and which can suppress the generation of voids in the bonded portions of the articles to be bonded to each other, and a bonding method using the same.

Mode for Carrying Out the Invention

The preferred embodiment of a bonding material according to the present invention is made of a copper paste comprising: a copper powder having an average particle diameter of 0.1 to 1 μm; and an alcohol solvent, wherein the content of the copper powder is in the range of from 80% by weight to 95% by weight, and the content of the alcohol solvent is in the range of from 5% by weight to 20% by weight.

The average particle diameter of the copper powder is in the range of from 0.1 μm to 1 μm, preferably in the range of from 0.2 μm to 0.8 μm, and more preferably in the range of from 0.3 μm to 0.5 μm. The copper powder is preferably a substantially spherical copper powder. The content of carbon in the copper powder is preferably 0.3% by weight or less, and more preferably 0.1% by weight or less.

The alcohol solvent is preferably a monoalcohol, a diol or a terpene alcohol, and may contain a triol. The monoalcohol is preferably a decanol or a dodecanol, and may be 2-(2-hexyloxyethoxy) ethanol, 2-[2-(2-ethylhexyloxy) ethoxy] ethanol, 2-(2-butoxyethoxy) ethanol or the like. The diol is preferably hexanediol or octanediol. The terpene alcohol is preferably terpineol, and may be 2-(1-methyl-1-(4-methyl-3-cyclohexyl) ethoxy) ethanol, isobonyl cyclohexanol or the like. The triol is preferably a methyl-butanetriol or glycerin. Furthermore, these alcohol solvents may be mixed to be used.

The content of the copper powder (preferably containing 0.3% by weight or less of carbon) in the copper paste is in the range of from 80% by weight to 95% by weight (preferably in the range of from 80% by weight to 90% by weight), and the content of the alcohol solvent therein is in the range of from 5% by weight to 20% by weight, the total of the content of the copper powder (preferably containing 0.3% by weight or less of carbon) and the content of the alcohol solvent being preferably 100% by weight. The copper paste is preferably in such a state that only the copper powder (preferably containing 0.3% by weight or less of carbon) is dispersed in the alcohol solvent by mixing and kneading the copper powder and the alcohol solvent.

The viscosity of the bonding material is preferably 150 Pa·s or less and more preferably 100 Pa·s or less when it is measured at 25° C. and 5 rpm by means of a rheometer.

When the bonding material arranged between articles is heated (while applying pressure between the articles) to sinter copper therein to bond the articles to each other via a copper bonding layer, the percentage of an area occupied by voids with respect to the area of the bonded surface of the copper bonding layer is preferably 10% or less (more preferably 5% or less), and the shear strength (force applied on one of the articles when the one article is peeled off from the other article by pushing the one article in a lateral direction (a horizontal direction)) is preferably 6 MPa or more (more preferably 30 MPa or more).

In the preferred embodiment of a bonding method according to the present invention, the above-described bonding material is arranged between articles to be heated (preferably while applying pressure between the articles) to sinter copper therein to form a copper bonding layer to bond the articles to each other with the copper bonding layer.

Specifically, the above-described bonding material is applied on at least one of two articles to be arranged between the articles to be dried by being heated at temperature of preferably 60 to 150° C. (more preferably 80 to 130° C.) while applying a pressure of preferably 1 to 20 MPa (more preferably 5 to 10 MPa) between the articles in an inert atmosphere, such as a nitrogen atmosphere, and then, heated at a temperature of preferably 200 to 400° C. (more preferably 250 to 370° C.), to sinter copper in the copper paste to form a copper bonding layer to bond the articles with the copper bonding layer.

Throughout the specification, the expression "average particle diameter" means an average primary particle diameter calculated from a field emission-scanning electron microscope (FE-SEM). The average primary particle diameter of copper particles can be calculated as follows. First, the copper particles are observed at a magnifying power of 20,000 by means of a field emission-scanning electron microscope (FE-SEM). Then, in a square measuring range wherein the total number of all copper particles having measurable major axes among the copper particles (primary particles) observed in a field of vision selected at random is about 200 to 500, the longest length of each of the copper particles is measured by means of an image analyzing particle size distribution measuring software (Mac-View Ver. 4 produced by Mountech Co., Ltd.). On the basis of the measured longest length of each of the copper particles, the average primary particle diameter can be calculated as a 50% particle diameter wherein the accumulated value in the number-size particle size distribution is 50%.

EXAMPLES

Examples of a bonding material and a bonding method using the same according to the present invention will be described below in detail.

Example 1

First, a mixed solution was prepared by mixing an aqueous copper nitrite solution, which was prepared by diluting 1174.6 g of a copper nitrite solution containing 50.2% by weight of cupric nitrite trihydrate with 486.9 g of pure water, with an aqueous citric acid solution which was prepared by dissolving 92.3 g of citric acid hydrate in 687 g of pure water. There was also prepared an aqueous sodium hydroxide solution deaerated with nitrogen by feeding nitrogen at a flow rate of 4.0 L/min into a 5 L reaction vessel from the upper portion thereof after 449.1 g of an aqueous sodium hydroxide solution containing 48.7% by weight of sodium hydroxide was mixed with 678 g of pure water to be put in the reaction vessel. Moreover, a hydrazine hydrate solution was prepared by dissolving 26.6 g of hydrazine hydrate (80% hydrazine hydrate produced by Otsuka Chemical Co., Ltd.) in 687 g of pure water.

Then, the above-described aqueous sodium hydroxide solution was put in a 5 L beaker with stirrer to be held at a liquid temperature of 27° C. While the solution was stirred at a rotation speed of 350 rpm, the above-described mixed solution was added thereto to form copper hydroxide. Thereafter, the above-described hydrazine hydrate solution was added thereto, and the temperature thereof was raised to 70° C. to be held for 2 hours to form cuprous oxide to prepare a cuprous oxide slurry.

After 113.9 g of hydrazine hydrate (80% hydrazine hydrate produced by Otsuka Chemical Co., Ltd.) was added to the cuprous oxide slurry thus obtained, the temperature thereof was raised to 90° C. to obtain a copper powder slurry. After the solid-liquid separation of the copper powder slurry was carried out, a solid content thus obtained was sufficiently washed with pure water and dried at 110° C. for 9 hours in a nitrogen atmosphere to obtain a copper powder. The copper powder thus obtained was observed by means of a field emission-scanning electronic microscope (FE-SEM) (S-4700 produced by Hitachi Ltd.). As a result, the copper powder was a powder of substantially spherical particles. The average particle diameter thereof was calculated to be 0.5 μm. The content of carbon in the copper powder was obtained by means of a carbon/sulfur analyzer (EMIA-220V produced by HORIBA, Ltd.). As a result, the content of carbon was 0.057% by weight.

Then, 20.666 g (86.9% by weight) of the copper powder thus obtained was mixed with 3.124 g (13.1% by weight) of octanediol (2-ethyl-1,3-hexanediol produced by Wako Pure Chemical Industries, Ltd.) serving as a solvent. The mixture thus obtained was put in a disposable cup to be kneaded at a revolution speed of 1400 rpm and a rotation speed of 700 rpm for 30 seconds by means of a kneading and defoaming mixer (V-mini 300 produced by EME Co., Ltd.). After this kneading was carried out once again, the mixture was put in another disposable cup, and the same kneading was carried out twice to obtain a bonding material of a copper paste.

The dispersion state of the bonding material (copper paste) thus obtained was visually observed. As a result, there was no separation of liquid, so that the dispersion state thereof was good. The viscosity of the bonding material (copper paste) was obtained by means of a rheometer (viscoelasticity measuring apparatus) (HAAKE Rheostress 600 produced by Thermo Scientific, Inc., used cone:)C35/2°. As a result, the viscosity measured at 25° C. and 5 rpm was 42 (Pa·s), and the print quality (printability) of the bonding material was good.

Then, there were prepared three pure copper plates (of oxygen-free copper C1020) having a size of 10 mm×10 mm×2 mm treated with 10% sulfuric acid after being degreased with industrial alcohol (SOLMIX AP7 produced by Japan Alcohol Trading Co., Ltd.), and three Si chips having a size of 3 mm×3 mm×0.3 mm plated with silver.

Then, a metal mask having a thickness of 50 μm was arranged on each of the copper plates, and the above-described bonding material (copper paste) was applied on each of the copper plates so as to have a size of 4 mm×4 mm and a thickness of 50 μm.

After each of the copper plates having the bonding material thus applied thereon was arranged in a bonding apparatus (a flip-chip bonder) (M90 DON-400 produced by HiSOL Inc.) to heat the bonding material at 100° C. in a nitrogen atmosphere to pre-dry the bonding material, it was cooled to 25° C., and then, the Si chip was arranged on the bonding material. Then, while a load was applied between the bonding material and the Si chip, the temperature thereof was raised at a temperature rising rate of 10° C./s from 25° C. to a firing temperature to be held for 5 minutes to fire the bonding material to sinter copper in the copper paste to form a copper bonding layer to bond the Si chip to the copper plate with the copper bonding layer to obtain a bonded product. Furthermore, the Si chips were bonded on the three copper plates on the first bonding conditions (on which the pre-drying period of time was 10 minutes, the load was 5 MPa, and the firing temperature was 350° C.), the second bonding conditions (on which the pre-drying period of time was 5 minutes, the load was 10 MPa, and the firing temperature was 300° C.), and the third bonding conditions (on which the pre-drying period of time was 5 minutes, the load was 10 MPa, and the firing temperature was 350° C.), respectively.

With respect to the each of bonded products thus obtained, voids having a diameter of not less than 0.1 mm on the bonded surface were observed at 50 MHz by means of a high-precision ultrasonic microscope (C-SAM) (D9500 produced by SONOSCAN, INC.), and a void fraction on the bonded surface (the percentage of an area occupied by voids with respect to the area of the bonded surface) was calculated. As a result, with respect to each of the bonded products, the void fraction was a low value of 0%, and it was good. The shear strength (force applied on the Si chip when the Si chip was peeled off from the copper plate by pushing the Si chip in a lateral direction (a horizontal direction)) of the bonded product was measured at a shear height of 50 μm and a test speed of 5 mm/min by means of a bonding strength tester (bond tester) (Series 4000 produced by DAGE Corporation). As a result, the shear strength was a high value of 84 MPa, 9 MPa and 100 MPa, respectively, and they were good.

Example 2

First, a mixed solution deaerated with nitrogen was prepared by feeding nitrogen at a flow rate of 4.0 L/min into a 5 L reaction vessel from the upper portion thereof after an aqueous copper nitrite solution, which was prepared by diluting 1412.3 g of a copper nitrite solution containing 50.1% by weight of cupric nitrite trihydrate with 249.2 g of pure water, was mixed with an aqueous citric acid solution, which was prepared by dissolving 110.8 g of citric acid hydrate in 684.3 g of pure water, to be put in the reaction vessel. Also, an aqueous sodium hydroxide solution was prepared by mixing 538 g of an aqueous sodium hydroxide solution containing 48.8% by weight of sodium hydroxide with 589 g of pure water. Moreover, a hydrazine hydrate solution was prepared by dissolving 31.9 g of hydrazine hydrate (80% hydrazine hydrate produced by Otsuka Chemical Co., Ltd.) in 684.3 g of pure water.

Then, the above-described aqueous copper nitrite solution was put in a 5 L beaker with stirrer to be held at a liquid temperature of 27° C. While the solution was stirred at a rotation speed of 350 rpm, the above-described aqueous sodium hydroxide solution was added thereto to form copper hydroxide, and the temperature thereof was raised to 35° C. Thereafter, the above-described hydrazine hydrate solution was added thereto, and the temperature thereof was raised to 50° C. to be held for 2 hours to form cuprous oxide to prepare a cuprous oxide slurry.

After 136.9 g of hydrazine hydrate (80% hydrazine hydrate produced by Otsuka Chemical Co., Ltd.) was added to the cuprous oxide slurry, the temperature thereof was raised to 90° C. to obtain a copper powder slurry. After the solid-liquid separation of the copper powder slurry was carried out, a solid content thus obtained was sufficiently washed with pure water and dried at 110° C. for 9 hours in a nitrogen atmosphere to obtain a copper powder. The copper powder thus obtained was observed by the same method as that in Example 1. As a result, the copper powder was a powder of substantially spherical particles. The average particle diameter thereof was calculated to be 0.4 μm. The content of carbon in the copper powder was obtained by the same method as that in Example 1. As a result, the content of carbon was 0.028% by weight.

Then, a bonding material of a copper paste was obtained by the same method as that in Example 1, except that there was used a mixture obtained by mixing 19.9968 g (86.4% by weight) of the obtained copper powder with 3.1368 (13.6% by weight) of octanediol (2-ethyl-1,3-hexanediol produced by Wako Pure Chemical Industries, Ltd.) serving as a solvent.

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 37 (Pa·s), and the print quality (printability) of the bonding material was good.

With respect to each of bonded products obtained by the same method as that in Example 1 using the bonding material thus obtained, the void fraction on the bonded surface and the shear strength were measured by the same methods as those in Example 1. As a result, the void fraction was a low value of 0%, and the shear strength was a high value of 87 MPa, 23 MPa and 22 MPa, respectively, and they were good.

Example 3

First, after 3800 g of pure water was put in a 5 L reaction vessel, air was fed at a flow rate of 0.5 L/min into the reaction vessel from the lower portion thereof, and the stirring rod was rotated in the reaction vessel. Then, 5.33 g of citric acid hydrate (produced by Fuso Chemical Co., Ltd.) serving as a complexing agent was put in the reaction vessel, and 43.17 g of cuprous oxide (NC-301 produced by Nissin Chemco Ltd., average particle diameter=2.5 μm) was put in the reaction vessel to allow a reaction at 30° C. for 2 hours to carry out a complexing treatment. Thereafter, the supply of air was stopped, and nitrogen was fed at a flow rate of 2.0 L/min into the reaction vessel from the upper portion thereof. Then, the temperature thereof was raised to 90° C., and 40.2 g of hydrazine hydrate (80% hydrazine hydrate produced by Otsuka Chemical Co., Ltd.) serving as a reducing agent was put in the reaction vessel to allow a reduction reaction to be held for 1 hour. Then, the stirring was stopped, and a solid content obtained by the reaction was washed and dried to obtain a copper powder. The copper powder thus obtained was observed by the same method as that in Example 1. As a result, the copper powder was a powder of substantially spherical particles. The average particle diameter thereof was calculated to be 0.2 μm. The content of carbon in the copper powder was obtained by the same method as that in Example 1. As a result, the content of carbon was 0.183% by weight.

Then, a bonding material of a copper paste was obtained by the same method as that in Example 1, except that there was used a mixture obtained by mixing 20.0471 g (87.0% by weight) of the obtained copper powder with 3.0047 g (13.0% by weight) of octanediol (2-ethyl-1,3-hexanediol produced by Wako Pure Chemical Industries, Ltd.) serving as a solvent.

The dispersion state of the bonding material (copper paste) thus obtained was observed by the same method as that in Example 1. As a result, the dispersion state thereof was nearly good although the bonding material was slightly aggregated. The viscosity of the bonding material was obtained by the same method as that in Example 1. As a result, the viscosity measured at 25° C. and 5 rpm was 18 (Pa·s), and the print quality (printability) of the bonding material was good.

With respect to a bonded product obtained (on the first bonding conditions) by the same method as that in Example 1 using the bonding material thus obtained, the void fraction on the bonded surface and the shear strength were measured by the same methods as those in Example 1. As a result, the void fraction was a low value of 3%, and the shear strength was a high value of 38 MPa, so that they were good.

Comparative Example 1

A copper powder coated with a gelatin was obtained by the same method as that in Example 2, except that 35.1 g of a collagen peptide (collagen peptide 800F produced by Nitta Gelatin Inc.) serving as the gelatin was added when hydrazine hydrate was added to the cuprous oxide slurry. The copper powder (coated with the gelatin) thus obtained was observed by the same method as that in Example 1. As a result, the copper powder was a powder of substantially spherical particles. The average particle diameter thereof was calculated to be 0.3 μm. The content of carbon in the copper powder was obtained by the same method as that in Example 1. As a result, the content of carbon was 0.347% by weight.

Then, a bonding material of a copper paste was obtained (on the first bonding conditions) by the same method as that in Example 1, except that there was used a mixture obtained by mixing 20.2517 g (86.4% by weight) of the obtained copper powder (coated with the gelatin) with 3.1805 g (13.6% by weight) of octanediol (2-ethyl-1,3-hexanediol produced by Wako Pure Chemical Industries, Ltd.) serving as a solvent.

The dispersion state of the bonding material (copper paste) thus obtained was observed by the same method as that in Example 1. As a result, the dispersion state thereof was nearly good although it was slightly plasmon. The viscosity of the bonding material was obtained by the same method as that in Example 1. As a result, the viscosity measured at 25° C. and 5 rpm was 59 (Pa·s), and the print quality (printability) of the bonding material was nearly good.

The bonding material thus obtained was used for attempting to produce a bonded product (on each of the first and third bonding conditions) by the same method as that in Example 1. However, it was not possible to bond the Si chip to the copper plate on each of the first and third bonding conditions. The bonding material thus obtained was also used for attempting to produce a bonded product by the same method as that in Example 1, except that the load was increased to 10 MPa. However, it was not possible to bond the Si chip to the copper plate.

Example 4

First, an aqueous copper sulfate solution was prepared by dissolving 2.240 kg of copper sulfate pentahydrate ($CuSO_4 \cdot 5H_2O$) in 5.353 kg of pure water, and an aqueous alkali solution was prepared by diluting 1.840 kg of an aqueous sodium hydroxide solution containing 48.4% by weight of sodium hydroxide with 6.800 kg of pure water.

After the above-described aqueous copper sulfate solution having a temperature of 27.3° C. was added to the above-described aqueous alkali solution held at 27.6° C. to be strongly stirred, the liquid temperature thereof was raised to 36.0° C. to be held to obtain a copper hydroxide suspension containing copper hydroxide deposited in the liquid. Furthermore, the equivalent ratio of sodium hydroxide to copper in the liquid was 1.24 when the above-described aqueous alkali solution was added to the above-described aqueous copper sulfate solution.

Then, an aqueous glucose solution prepared by dissolving 2.419 kg of glucose in 3.433 kg of pure water was added to the above-described copper hydroxide suspension in a nitrogen atmosphere. After the liquid temperature thereof was raised to 70.6° C. in 30 minutes, it was held for 30 minutes. After air was fed into the copper hydroxide suspension at a flow rate of 2.26 L/min to carry out the bubbling thereof for 200 minutes, it was allowed to stand for one day in a nitrogen atmosphere. Thereafter, a supernatant liquid thus obtained was removed to collect nearly the entire amount of precipitate, and 2.32 kg of pure water was added to this precipitate to obtain 4.80 kg of a cuprous oxide suspension.

While the cuprous oxide suspension thus obtained was put in a reaction vessel to be stirred, the temperature thereof was held at 45.0° C., and 1.25 equivalent (1.25 times as large as stoichiometry required to entirely reduce cuprous oxide) of hydrazine hydrate (80.5% hydrazine hydrate) was added thereto. Thereafter, the temperature of the suspension was raised to 50.0° C. in 30 minutes, and further raised to 85.0° C. in 70 minutes to be held. Then, 0.600 equivalent of hydrazine hydrate (80.5% hydrazine hydrate) was dividedly added thereto in 30 minutes to entirely reduce cuprous oxide to copper to obtain a copper powder slurry. After the solid-liquid separation of the copper powder slurry was carried out, a solid content thus obtained was sufficiently washed with pure water and dried at 110° C. for 9 hours in a nitrogen atmosphere to obtain a copper powder. The copper powder thus obtained was observed by means of a field emission-scanning electronic microscope (FE-SEM) (S-4700 produced by Hitachi Ltd.). As a result, the copper powder was a powder of substantially spherical particles. The average particle diameter thereof was calculated to be 1.0 μm. The content of carbon in the copper powder was obtained by means of a carbon/sulfur analyzer (EMIA-220V produced by HORIBA, Ltd.). As a result, the content of carbon was 0.019% by weight.

Then, a bonding material of a copper paste was obtained by the same method as that in Example 1, except that there was used a mixture obtained by mixing 13.1 g (87.0% by weight) of the copper powder thus obtained with 2.0 g (13.0% by weight) of octanediol (2-ethyl-1,3-hexanediol produced by Wako Pure Chemical Industries, Ltd.).

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 32 (Pa·s), and the print quality (printability) of the bonding material was good.

With respect to a bonded product obtained (on the first bonding conditions) by the same method as that in Example 1 using the bonding material thus obtained, the void fraction on the bonded surface and the shear strength were measured by the same methods as those in Example 1. As a result, the void fraction was a low value of 0%, and the shear strength was a high value of 14.6 MPa, so that they were good.

Comparative Example 2

First, an aqueous copper sulfate solution was prepared by dissolving 2.240 kg of copper sulfate pentahydrate ($CuSO_4 \cdot 5H_2O$) in 5.353 kg of pure water, and an aqueous alkali solution was prepared by diluting 1.840 kg of an aqueous sodium hydroxide solution containing 48.4% by weight of sodium hydroxide with 6.800 kg of pure water.

After the above-described aqueous copper sulfate solution having a temperature of 27.3° C. was added to the above-described aqueous alkali solution held at 27.6° C. to be strongly stirred, the liquid temperature thereof was raised to 36.0° C. to be held to obtain a copper hydroxide suspension containing copper hydroxide deposited in the liquid. Furthermore, the equivalent ratio of sodium hydroxide to copper in the liquid was 1.24 when the above-described aqueous alkali solution was added to the above-described aqueous copper sulfate solution.

Then, an aqueous glucose solution prepared by dissolving 2.419 kg of glucose in 3.433 kg of pure water was added to the above-described copper hydroxide suspension in a nitrogen atmosphere. After the liquid temperature thereof was raised to 70.6° C. in 30 minutes, it was held for 30 minutes.

After air was fed into the copper hydroxide suspension at a flow rate of 2.26 L/min to carry out the bubbling thereof for 200 minutes, it was allowed to stand for one day in a nitrogen atmosphere. Thereafter, the supernatant liquid was removed to collect nearly the entire amount of precipitate, and 2.32 kg of pure water was added to this precipitate to obtain 4.80 kg of a cuprous oxide suspension.

While the cuprous oxide suspension thus obtained was put in a reaction vessel to be stirred, the temperature thereof was held at 45.0° C., and 0.223 equivalent (0.223 times as large as stoichiometry required to entirely reduce cuprous oxide) of hydrazine hydrate (80.5% hydrazine hydrate) was added thereto. Thereafter, the temperature of the suspension was raised to 49.1° C. in 30 minutes, and 0.668 equivalent of hydrazine hydrate (80.5% hydrazine hydrate) was dividedly added thereto in 120 minutes. Thereafter, the temperature thereof was raised to 84.1° C. in 140 minutes to be held, and 1.055 equivalent of hydrazine hydrate (80.5% hydrazine hydrate) was dividedly added thereto in 150 minutes to entirely reduce cuprous oxide to copper to obtain a copper powder slurry. After the solid-liquid separation of the copper powder slurry was carried out, a solid content thus obtained was sufficiently washed with pure water and dried at 110° C. for 9 hours in a nitrogen atmosphere to obtain a copper powder. The copper powder thus obtained was observed by means of a field emission-scanning electronic microscope (FE-SEM) (S-4700 produced by Hitachi Ltd.). As a result, the copper powder was a powder of substantially spherical particles. The average particle diameter thereof was calculated to be 3.0 μm. The content of carbon in the copper powder was obtained by means of a carbon/sulfur analyzer (EMIA-220V produced by HORIBA, Ltd.). As a result, the content of carbon was 0.051% by weight.

Then, a bonding material of a copper paste was obtained by the same method as that in Example 1, except that there was used a mixture obtained by mixing 13.1 g (87.0% by weight) of the copper powder thus obtained with 2.0 g (13.0% by weight) of octanediol (2-ethyl-1,3-hexanediol produced by Wako Pure Chemical Industries, Ltd.).

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 5.7 (Pa·s), and the print quality (printability) of the bonding material was good.

With respect to a bonded product obtained (on the second bonding conditions) by the same method as that in Example 1 using the bonding material thus obtained, the void fraction on the bonded surface and the shear strength were measured by the same methods as those in Example 1. As a result, the void fraction was a high value of 20%, and the shear strength was a low value of 4.2 MPa, so that they were not good.

Example 5

A bonding material of a copper paste was obtained by the same method as that in Example 1, except that there was used a mixture obtained by mixing 13.1 g (87.0% by weight) of the copper powder obtained in Example 2 with 2.0 g (13.0% by weight) of 1-decanol (produced by Wako Pure Chemical Industries, Ltd.) serving as a solvent.

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 7.6 (Pa·s), and the print quality (printability) of the bonding material was good.

With respect to a bonded product obtained (on the second bonding conditions) by the same method as that in Example 1 using the bonding material thus obtained, the void fraction on the bonded surface and the shear strength were measured by the same methods as those in Example 1. As a result, the void fraction was a low value of 0%, and the shear strength was a high value of 12.2 MPa, so that they were good.

Example 6

A bonding material of a copper paste was obtained by the same method as that in Example 1, except that there was used a mixture obtained by mixing 13.1 g (87.0% by weight) of the copper powder obtained in Example 2 with 2.0 g (13.0% by weight) of 1-dodecanol (produced by Tokyo Chemical Industry Co., Ltd.) serving as a solvent.

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 16.8 (Pa·s), and the print quality (printability) of the bonding material was good.

With respect to a bonded product obtained (on the second bonding conditions) by the same method as that in Example 1 using the bonding material thus obtained, the void fraction on the bonded surface and the shear strength were measured by the same methods as those in Example 1. As a result, the void fraction was a low value of 0%, and the shear strength was a high value of 14.7 MPa, so that they were good.

Example 7

A bonding material of a copper paste was obtained by the same method as that in Example 1, except that there was used a mixture obtained by mixing 13.1 g (87.0% by weight) of the copper powder obtained in Example 2 with 1.0 g (6.5% by weight) of octanediol (2-ethyl-1,3-hexanediol produced by Wako Pure Chemical Industries, Ltd.) and 1.0 g (6.5% by weight) of 2-methylbutane-1,2,4-triol (IPLT-B produced by Nippon Terpene Chemicals, Inc.) serving as solvents.

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 96.4 (Pa·s), and the print quality (printability) of the bonding material was good.

With respect to a bonded product obtained (on the second bonding conditions) by the same method as that in Example 1 using the bonding material thus obtained, the void fraction on the bonded surface and the shear strength were measured by the same methods as those in Example 1. As a result, the void fraction was a low value of 0%, and the shear strength was a high value of 11.6 MPa, so that they were good.

Example 8

A bonding material of a copper paste was obtained by the same method as that in Example 1, except that there was used a mixture obtained by mixing 13.1 g (87.0% by weight) of the copper powder obtained in Example 2 with 2.0 g (13.0% by weight) of 2,5-hexanediol (produced by Tokyo Chemical Industry Co., Ltd.) serving as a solvent.

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 16.8 (Pa·s), and the print quality (printability) of the bonding material was good.

With respect to a bonded product obtained (on the second bonding conditions) by the same method as that in Example 1 using the bonding material thus obtained, the void fraction on the bonded surface and the shear strength were measured by the same methods as those in Example 1. As a result, the void fraction was a low value of 0%, and the shear strength was a high value of 12.2 MPa, so that they were good.

Example 9

A bonding material of a copper paste was obtained by the same method as that in Example 1, except that there was used a mixture obtained by mixing 13.1 g (87.0% by weight) of the copper powder obtained in Example 2 with 2.0 g (13.0% by weight) of 2-(2-hexyloxy) ethoxy) ethanol (hexyl diglycol produced by Nippon Nyukazai Co., Ltd.) serving as a solvent.

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 10.1 (Pa·s), and the print quality (printability) of the bonding material was good.

With respect to a bonded product obtained (on the second bonding conditions) by the same method as that in Example 1 using the bonding material thus obtained, the void fraction on the bonded surface and the shear strength were measured by the same methods as those in Example 1. As a result, the void fraction was a low value of 0%, and the shear strength was a high value of 19.0 MPa, so that they were good.

Example 10

A bonding material of a copper paste was obtained by the same method as that in Example 1, except that there was used a mixture obtained by mixing 13.1 g (87.0% by weight) of the copper powder obtained in Example 2 with 2.0 g (13.0% by weight) of 2-(1-methyl-1-(4-methyl-3-cyclohexyl) ethoxy ethanol (TOE-100 produced by Nippon Terpene Chemicals, Inc.) serving as a solvent.

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 46.0 (Pa·s), and the print quality (printability) of the bonding material was good.

With respect to a bonded product obtained (on the second bonding conditions) by the same method as that in Example 1 using the bonding material thus obtained, the void fraction on the bonded surface and the shear strength were measured by the same methods as those in Example 1. As a result, the void fraction was a low value of 0%, and the shear strength was a high value of 13.3 MPa, so that they were good.

Example 11

A bonding material of a copper paste was obtained by the same method as that in Example 1, except that there was used a mixture obtained by mixing 13.1 g (87.0% by weight) of the copper powder obtained in Example 2 with 2.0 g (13.0% by weight) of terpineol (produced by Wako Pure Chemical Industries, Ltd.) serving as a solvent.

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 41.6 (Pa·s), and the print quality (printability) of the bonding material was good.

With respect to a bonded product obtained (on the second bonding conditions) by the same method as that in Example 1 using the bonding material thus obtained, the void fraction on the bonded surface and the shear strength were measured by the same methods as those in Example 1. As a result, the void fraction was a low value of 0%, and the shear strength was a high value of 25.8 MPa, so that they were good.

Example 12

A bonding material of a copper paste was obtained by the same method as that in Example 1, except that there was used a mixture obtained by mixing 12.0 g (80.0% by weight) of the copper powder obtained in Example 2 with 3.0 g (20.0% by weight) of octanediol (2-ethyl-1,3-hexanediol produced by Wako Pure Chemical Industries, Ltd.) serving as a solvent.

The dispersion state of the bonding material (copper paste) thus obtained was observed by the same method as that in Example 1. As a result, the dispersion state thereof was good. The viscosity of the bonding material was obtained by the same method as that in Example 1. As a result, the viscosity measured at 25° C. and 5 rpm was 4.6 (Pa·s), and the print quality (printability) of the bonding material was good.

With respect to a bonded product obtained (on the second bonding conditions) by the same method as that in Example 1 using the bonding material thus obtained, the void fraction on the bonded surface and the shear strength were measured by the same methods as those in Example 1. As a result, the void fraction was a low value of 0%, and the shear strength was a high value of 22.0 MPa, so that they were good.

Comparative Example 3

It was attempted to obtain a bonding material of a copper paste by the same method as that in Example 1, except that there was used a mixture obtained by mixing 13.1 g (87.0% by weight) of the copper powder obtained in Example 2 with 2.0 g (13.0% by weight) of dibutyl diglycol (produced by Nippon Nyukazai Co., Ltd.) serving as a glycol ester solvent. However, it was not possible to obtain any paste.

Comparative Example 4

It was attempted to obtain a bonding material of a copper paste by the same method as that in Example 1, except that there was used a mixture obtained by mixing 13.1 g (87.0% by weight) of the copper powder obtained in Example 2 with 2.0 g (13.0% by weight) of tetradecane (produced by Tokyo Chemical Industry Co., Ltd.) serving as a hydrocarbon solvent. However, it was not possible to obtain any paste.

Comparative Example 5

It was attempted to obtain a bonding material of a copper paste by the same method as that in Example 1, except that there was used a mixture obtained by mixing 13.1 g (87.0% by weight) of the copper powder obtained in Example 2 with 2.0 g (13.0% by weight) of butyl carbitol acetate (produced by Wako Pure Chemical Industries, Ltd.) serving as a glycol ester solvent. However, it was not possible to obtain any paste.

The invention claimed is:

1. A bonding material of a copper paste comprising:
   a copper powder of copper having an average particle diameter of 0.1 to 1 μm; and
   an alcohol solvent consisting of a triol and one solvent which is selected from a monoalcohol, a diol and a terpene alcohol,
   wherein the content of the copper powder is in the range of from 80% by weight to 95% by weight, and the content of the alcohol solvent is in the range of from 5% by weight to 20% by weight, the total of the content of the copper powder and the content of the alcohol solvent being 100% by weight.

2. A bonding material as set forth in claim 1, wherein the content of carbon in said copper powder is not larger than 0.3% by weight.

3. A bonding material as set forth in claim 1, which has a viscosity of not greater than 150 Pa·s when the viscosity of said bonding material is measured at 25° C. and 5 rpm by means of a rheometer.

4. A bonding material as set forth in claim 1, wherein a percentage of an area occupied by voids with respect to the area of a bonded surface of a copper bonding layer is not larger than 10% when said bonding material arranged between articles is heated to sinter copper therein to bond the articles to each other via the copper bonding layer.

5. A bonding material as set forth claim 1, wherein shear strength is not less than 6 MPa when said bonding material arranged between articles is heated to sinter copper therein to bond the articles to each other via the copper bonding layer.

6. A bonding method comprising the steps of:
   arranging a bonding material, as set forth claim 1, between articles; and
   heating the bonding material to sinter copper therein to form a copper bonding layer to bond said articles to each other with the copper bonding layer.

7. A bonding method as set forth in claim 6, wherein said heating is carried out while pressure is applied between said articles.

* * * * *